United States Patent

Ando et al.

[15] 3,694,704

[45] Sept. 26, 1972

[54] SEMICONDUCTOR DEVICE

[72] Inventors: Tetsuo Ando, Tokyo; Hiroshi Yamazaki, Kanagawa-ken, both of Japan

[73] Assignee: Sony Corporation, Tokyo, Japan

[22] Filed: Sept. 28, 1970

[21] Appl. No.: 75,910

[30] Foreign Application Priority Data

Sept. 29, 1970 Japan ......................45/77645

[52] U.S. Cl..........317/235 R, 317/235 G, 317/235 B, 317/235 E

[51] Int. Cl.............................................H01l 19/00

[58] Field of Search.......................................317/235

[56] References Cited

UNITED STATES PATENTS

| | | | |
|---|---|---|---|
| 3,555,374 | 1/1971 | Usuda | 317/235 |
| 3,469,155 | 9/1969 | Van Beek | 317/235 |
| 3,456,169 | 5/1969 | Klein | 317/235 |
| 3,502,950 | 3/1970 | Nigh et al. | 317/235 |

*Primary Examiner*—John W. Huckert
*Assistant Examiner*—E. Wojciechowicz
*Attorney*—Lewis H. Eslinger, Alvin Sinderbrand and Curtis, Morris and Safford

[57] ABSTRACT

A semiconductor for a memory circuit has a semiconductor substrate with a plurality of MIS transistors formed therein, and a conductive layer is provided on an insulating layer of the semiconductor device to supply a clock pulse to said memory circuit and is connected to a diffusion region formed in the substrate under the conductive layer.

4 Claims, 13 Drawing Figures

INVENTOR.
TETSUO ANDO
HIROSHI YAMAZAKI
ATTORNEYS

INVENTOR.
TETSUO ANDO
HIROSHI YAMAZAKI
ATTORNEYS

INVENTOR.

TETSUO ANDO
HIROSHI YAMAZAKI

ATTORNEYS

SEMICONDUCTOR DEVICE

This invention relates generally to a semiconductor device, and more particularly to a semiconductor device having formed therein a memory circuit employing Metal Insulator Semiconductor (MIS) transistors.

Heretofore, various memory circuits have been proposed which are of the type employing MIS or MOS transistors, for example, as disclosed in U. S. Pat. Application No. 868,800, filed Oct. 23, 1969, and having a common assignee herewith. Generally, such a memory circuit requires for its operation a clock pulse to be used as a time base, and hence has a clock pulse supply lead. The clock signal supply lead is formed on an insulating layer provided on the semiconductor substrate, so that an inversion layer is produced on the surface of the substrate by an electric field generated by the clock signal supply to thereby form a channel. Therefore, there is the possibility that the clock signal supply lead may act as a gate electrode to form an unwanted parasitic MIS transistor in the substrate which eliminates a signal stored in the memory circuit and thereby causes faulty operation. The formation of the inversion layer can be avoided by sufficient thickening of the insulating layer, but this is very difficult in terms of the method of manufacture and further the thickness of the insulating layer is limited because a thick insulating layer tends to crack and the possibility of bending of the substrate is increased due to the difference in the coefficient of thermal expansion between the insulating layer and the substrate. Therefore, it has been very difficult to produce a semiconductor device formed of MIS transistors constituting a memory circuit and which is free from the aforementioned defects.

It is an object of this invention to provide a semiconductor device of the described type which avoids the above mentioned problems encountered heretofore.

Another object is to provide a semiconductor device of the described type which avoids the formation of the mentioned parasitic MIS transistor and the problems resulting therefrom without the use of a thick insulating layer.

In accordance with an aspect of this invention, there is formed, in the substrate below the clock signal supply lead, a diffusion region which is opposite in polarity to the substrate and is electrically connected to the clock signal supply lead. Accordingly, in the semiconductor device of this invention, the insulating layer under the clock signal supply lead can be formed as thin as possible, and this facilitates manufacture of the semiconductor device and decreases the possibility of faulty operation.

Figure 1:
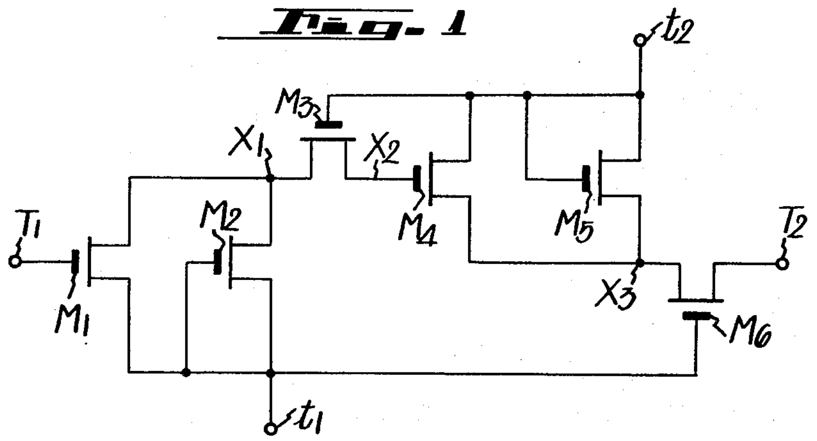
FIG. 1 is a wiring diagram showing an example of a flip-flop circuit made up of MIS transistors which may constitute a portion of a memory circuit.

Referring in detail to FIG. 1, it will be seen that the circuit there shown is a flip-flop circuit that may constitute a portion of a memory circuit.

In FIG. 1, reference characters $M_1$ to $M_6$indicate MIS transistors which, in the illustrated example may be enhancement-type N-channel insulated-gate transistors. The transistor $M_1$has its gate connected to an input terminal $T_1$, its drain connected, at the connected point $X_1$, with the drain of the transistor $M_2$ and with the source of the transistor $M_3$, and its source connected to a first clock pulse input terminal $t_1$. The transistor $M_2$ has its gate and source connected to the input terminal $t_1$ and the transistor $M_3$ has its gate connected to a second clock pulse input terminal $t_2$. A circuit which forms a counterpart to the circuit made up of the transistors $M_1$, $M_2$ and $M_3$ is formed with transistors $M_4$, $M_5$ and $M_6$. More specifically, the transistor $M_4$ has its gate connected to the drain of the transistor $M_3$as indicated point $X_2$, and its drain connected, at the connection point $X_3$, with the drain of the transistor $M_5$ and with the source of the transistor $M_6$. The source of the transistor $M_4$ is connected to the input terminal $t_2$. The gate and source of the transistor $M_5$ are connected to the input terminal $t_2$, and the gate of the transistor $M_6$ is connected to the input terminal $t_1$ while the drain of the transistor $M_6$ is connected to an output terminal $T_2$. The transistors $M_1$ to $M_6$ are formed on a common semiconductor substrate, which is grounded.

Figures 2A, 2B, 2C, 2D, 2E, 2F, 2G:
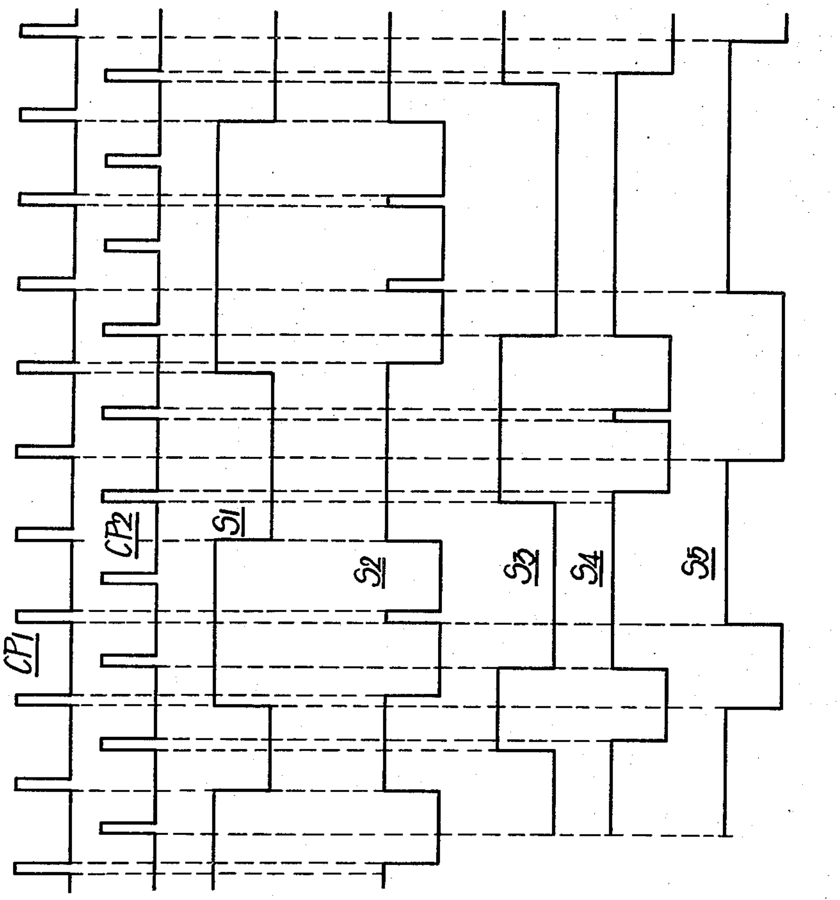
FIG. 2A–2G are waveform diagrams, for explaining the operation of the circuit depicted in FIG. 1.

The input terminal $t_1$ is supplied with a first clock pulse $CP_1$, such as is shown in FIG. 2A, while the input terminal $t_2$ is supplied with a second clock pulse $CP_2$, such as is depicted in FIG. 2B, and such clock pulse $CP_2$ is displaced a predetermined angle apart in phase from the first clock pulse $CP_1$. The operation of the circuit of FIG. 1 will be described with the aid of the positive logic in which the higher level of two values is referred to as "1" and the lower lever as "0".

The input terminal $T_1$ is supplied with an input pulse $S_1$, such as shown in FIG. 2C, which is synchronized with the clock pulse $CP_1$. When the input pulse $S_1$ is "1" the transistor $M_1$ is in the on state and, when the input pulse $S_1$ is "0", the transistor $M_1$ is in the off state.

The first clock pulse $CP_1$ supplied to the input terminal $t_1$ is fed to the gate of the transistor $M_2$, and consequently the transistor $M_2$ turns on when the clock pulse $Cp_1$ is "1". The clock pulse $CP_1$ is also supplied to the source of the transistor $M_2$ so that, when the transistor $M_1$ is held in the off state by the input pulse $S_1$ being "0", the potential at the connection point $X_1$ is raised up to "1" by the clock pulse $CP_1$ and, at the same time, a capacitor formed between the connection point $X_1$ and the semiconductor substrate is charged by the clock pulse $CP_1$ of the level "1", and accordingly the connection point $X_1$ is held at the level "1" by the charge.

When the transistor $M_1$ is turned on by the input pulse $S_1$ being "1", the charge stored between the connection point $X_0$and the semiconductor substrate is discharge through the transistor $M_1$, so that the potential at the connection point $X_1$ rises up to "1" each time the level of the clock pulse $CP_1$ becomes "1".

When the clock pulse $CP_1$ is at the level "0" the potential at the connection point $X_1$ is "0" irrespective of the state of the transistor $M_1$. As a result of this, an output pulse $S_2$ such as is depicted in FIG. 2D is derived at the connection point $X_1$ in response to the input pulse $S_1$.

The output pulse $S_2$ and the clock pulse $CP_2$ are supplied to the transistor $M_3$, which turns on when the clock pulse $CP_2$ is at the level "1". Consequently, when the output pulse $S_2$ is at the level "1" and the transistor $M_3$ is turned on by the clock pulse $CP_2$, the capacitor formed between the connection point $X_0$and the semiconductor substrate is charged by the output pulse $S_2$ of the level "1", and accordingly the connection point $X_2$ is held at the level "1" by the charge. The charge thus stored is discharged through the transistor $M_3$ turned on by the clock pulse $CP_2$ when the output pulse $S_2$ is at the level "0. More specifically, while the output pulse $S_2$ is at the level "0" the potential at the connection point $X_2$ decreases down to "0" when the level of the clock pulse $CP_2$ rises up to "1". Accordingly, there is derived at the connection point $X_2$ an output pulse $S_3$, such as is shown in FIG. 2E, which output pulse $S_3$is opposite in phase to the input pulse $S_1$ and delayed behind it by the phase difference between the clock pulses $CP_1$ and $CP_2$.

The output pulse $S_3$ is supplied to the gate of the transistor $M_4$ of the circuit which follows the circuit made up of the transistors $M_1$ to $M_3$ and which consists of the transistors $M_4$to $M_6$ operating in the same manner as the circuit made up of transistor $M_1$ to $M_3$. The clock pulses $CP_1$ and $CP_2$ in the circuit made up of transistors $M_4$ to $M_6$ respectively correspond to the clock pulses $CP_2$ and $CP_1$ in the circuit made up of transistors $M_1$ to $M_3$. Accordingly, there is derived, at the connection point $X_3$, an output pulse $S_4$, such as is shown in FIG. 2F, which corresponds to the output pulse $S_2$, while, at the output terminal $T_2$, there is derived an output, such as is depicted in FIG. 2G, which is opposite in phase to the output pulse $S_3$ and delayed behind it by the phase difference between the pulses $CP_2$ and $CP_1$. Thus, as shown, the output pulse $S_5$ is delayed behind the input pulse $S_1$ by one cycle, that is, one bit time.

Consequently, the circuit illustrated in FIG. 1 constitutes a delay flip-flop circuit, and it will be apparent that a memory circuit can be formed from a plurality of such circuits.

Figure 3:
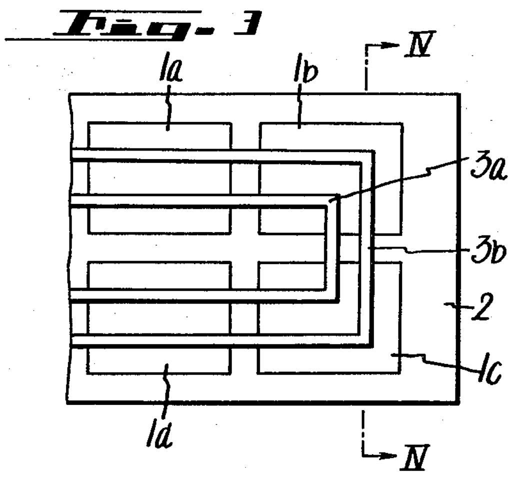
FIG. 3 is a schematic plan view of a conventional semiconductor device made up of a number of the circuits shown on FIG. 1, and to which reference will be made in explaining the problem overcome by the present invention.

In order to form such a memory circuit from the described flip-flop circuits, a suitable number, for example, four circuits similar to that of FIG. 1, may be formed on a single semiconductor substrate 2, as indicated at *1a*, *1b*, *1c* and *1d* in FIG. 3. The flip-flop circuits 1a to 1d are supplied with the clock pulses $CP_1$ and $CP_2$ through common internal leads 3a and 3b. If the transistors $M_3$ of the flip-flop circuits 1b and 1c performing different functions are formed close to each other in the substrate 2, as in the prior art configuration depicted in FIG. 4, a parasitic MIS transistor is formed.

Figure 4:
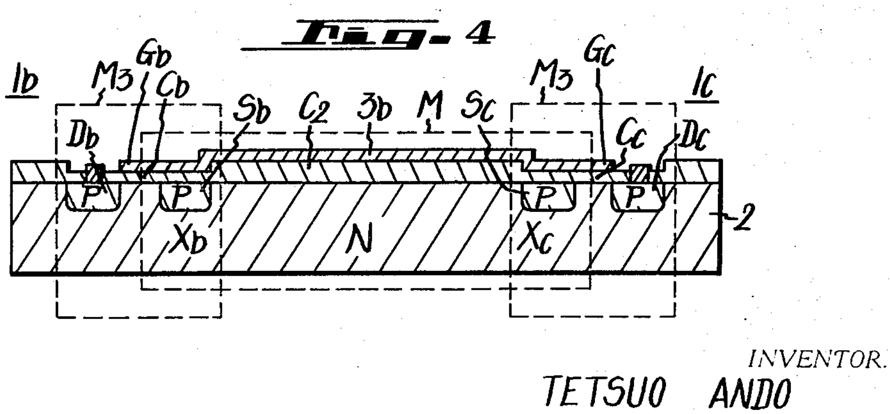
FIG. 4 is a cross-sectional view taken along the line IV—IV in FIG. 3.

More specifically, as shown in FIG. 4, drain and source electrodes Db and Sb of the transistor $M_3$ of the flip-flop circuit *1b* are formed by P-type semiconductor layers in the N-type semiconductor substrate 2, an insulating layer Cb is formed of a relatively thin oxide film over the electrodes Db and Sb and a gate electrode Gb is formed on the insulating layer Cb, thus providing the transistor $M_3$of the flip-flop circuit *1b*.

Similarly, the transistor $M_3$ of the flip-flop circuit *1c* is formed with source and drain electrodes Sc and Dc, an insulating layer Cc and a gate electrode Gc. In the illustrated device a relatively thick insulating layer $C_2$ is formed on the substrate 2 at the area between the insulating layers Cb and Cc and an internal lead *3b* is formed on the insulating layer $C_2$ to interconnect the gate electrodes Gb and Gc. The internal lead 3b is supplied with the clock pulse $CP_2$ from the terminal $t_2$ (not shown in FIG. 4).

Figure 5:
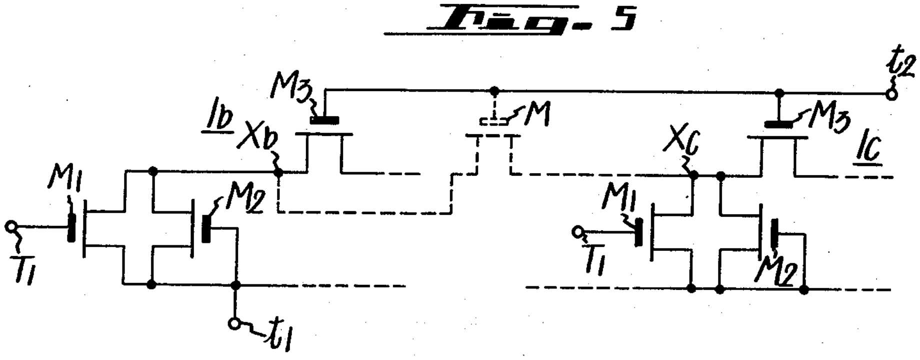
FIG. 5 is a wiring diagram illustrating an equivalent circuit of the device shown in FIGS. 3 and 4.

As a result of the above arrangement, a parasitic MIS transistor M is formed by the electrodes Sb and Sc, the insulating layer $C_2$ and the internal lead *3b*. An equivalent circuit of the semiconductor device depicted in FIGS. 3 and 4 is shown in FIG. 5 in which a point Xb connected to the source of the transistor $M_3$ of the flip-flop circuit *1b* and a point X*c* connected to the source of the transistor $M_3$ of the flip-flop circuit 1c are interconnected through the drain and source of the parasitic transistor M and the gate of the parasitic transistor M is connected to the terminal $t_2$. Consequently, when the level of the clock pulse $CP_2$ supplied to the internal lead *3b* through the input terminal $t_2$ exceeds a threshold voltage determined by the insulating layer $C_2$, an inversion layer is formed in the surface of the semiconductor substrate 2 under the insulating layer $C_2$, thus forming a channel between the electrodes Sb and Sc. Accordingly, in the event that the level of the clock pulse $CP_2$ is higher than the threshold voltage of the parasitic transistor M, when the potential at either one of the connection points Xb and Xc is at the level "1" and the potential at the other connection point is at the level "0", the charge stored up to the level "1" is discharged through the parasitic transistor M, and therefore, a signal to be read out is lost to thereby cause a false operation of the flip-flop circuit.

Figure 6:
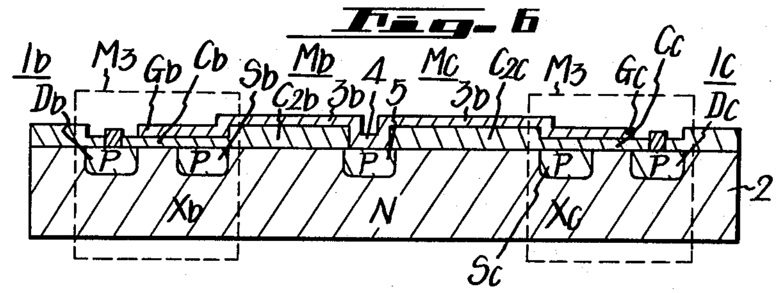
FIG. 6 is a cross-sectional view, similar to FIG. 4 but showing one example of a semiconductor device according to this invention.

Referring now to FIG. 6 illustrating one embodiment of this invention it will be seen that the semiconductor device there shown constitutes a memory circuit made up of insulated-gate field effect transistors or MIS transistors arranged similarly to the device of FIG. 4, but in which false operation due to the parasitic transistor is avoided. In FIG. 6 elements similar to those appearing in FIG. 4 are identified by the same reference numerals and characters.

In accordance with this invention, as shown, a P-type semiconductor layer 5 is formed substantially intermediate the source electrode Sb of the transistor $M_3$ of the flip-flop circuit 1b and the source electrode Sc of the transistor $M_3$ of the flip-flop circuit *1c* in the N-type semiconductor substrate 2 to form a PN junction between the P-type semiconductor layer 5 and the N-type semiconductor substrate 2. The P-type semiconductor layer 5 may be formed simultaneously with the formation of the source and drain electrodes of each transistor. Further, the P-type semiconductor layer 5 has deposited thereon an electrode 4. In the present example the internal lead *3b* for the supply of the clock pulse $CP_2$ is connected to the electrode 4 to connect the P-type semiconductor layer 5 with the gate electrodes Gb and Gc of the transistors $M_3$.

With such an arrangement, the clock pulse $CP_2$ is supplied to the P-type semiconductor layer 5 through the internal lead **3*b* so that, when the level of the clock pulse $CP_2$ exceeds the threshold voltage determined by the insulating layers $C_{2b}$ and $C_{2c}$, channels are formed in the semiconductor substrate 2 under the insulating layers $C_{2b}$ and $C_{2c}$, namely between the electrode Sb and the semiconductor layer 5 and between the semiconductor layer 5 and the electrode Sc. However, even if the potential at the connection point Xb or Xc on FIG. 5 is at the level "1", the voltage at the connection point Xb or Xc, namely at the electrode Sb or Sc, does not ever exceed the level of the clock pulse $CP_2$. Consequently, at the time of supplying the clock pulse $CP_2$, the charges stored at the connection points Xb and Xc are not discharged into the semiconductor layer 5** through the channels, thus eliminating the possibility that the potentials at the connection points Xb and Xc will be at the level "0" by mistake rather than at the intended level "1".

Figure 7:
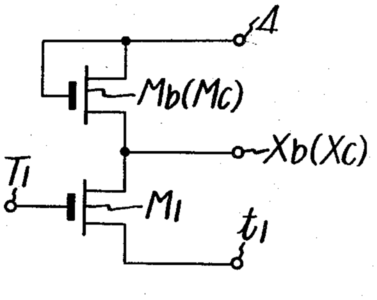
FIG. 7 is a wiring diagram to which reference will be made in expalining this invention.

Further, there is no possibility that, when the potential at the connection point Xb or Xc is at the level "0", it will be raised up to the level "1" by voltage derived from the semiconductor layer 5. Equivalent circuits of parasitic MIS transistors Mb and Mc formed in association with the insulating layers $C_{2b}$ and $C_{2c}$ and the transistors $M_3$ of the flip-flop circuits 1b and 1c areas depicted in FIG. 7, in which the drain of the transistor $M_1$ is connected to the connection point Xb (Xc), the connection point Xb (Xc) is connected to the electrode 4 through the drain and source of the parasitic transistor Mb (Mc) and the gate of the parasitic transistor Mb (Mc) is connected to the electrode 4.

It will be seen from FIG. 6 that the insulating layer $C_{2b}$ ($C_{2c}$) for insulating the gate of the parasitic transistor Mb (Mc) is formed thicker than that for insulating the gate of the transistor $M_1$, so that the mutual conductance of the parasitic transistor Mb (Mc) is smaller than that of the transistor $M_1$.

Accordingly, even if the clock pulse $CP_2$ is supplied to the electrode 4 through the terminal $t_2$, the voltage of the clock pulse $CP_2$ is divided by the transistors Mb (Mc) and $M_1$, so that the voltage derived at the connection point Xb (Xc) is very small. Therefore, even if the level of the clock pulse $CP_2$ is higher than the threshold voltages of the parasitic transistors Mb and Mc, the level "0" of the potentials at the connection points Xb and Xc will not rise up to "1" by false operation.

Consequently, it is preferred that the P-type semiconductor layer 5 be formed in the substrate 2 at the center of the portion of the semiconductor device where the parasitic transistor will be formed.

Further, the P-type semiconductor layer 5 is preferably made smaller than the source and drain regions of the MIS transistor because it increases the degree of integration of the circuits and decreases the size of the internal lead needed for the clock pulse supply.

It will be apparent from the above that the present invention eliminates a bad influence, such as faulty operation, of the parasitic MIS transistor formed under the internal lead for the clock pulse supply in a semiconductor device in which, for example, a plurality of flip-flop circuits are formed of MIS transistors in one semiconductor substrate to provide a memory circuit. Accordingly, this invention allows proper selection of the thickness of the insulating layer under the internal lead for the clock pulse supply irrespective of the voltage of the clock pulse.

In the described example, it is possible, of course, to exchange the positions of the drain and source of each MIS transistor.

Although an illustrative embodiment of the invention has been described in detail herein with reference to the accompanying drawings, it is to be understood that the invention is not limited to that precise embodiment of the invention, and that various changes and modifications may be effected therein by one skilled in the art without departing from the scope or spirit of the invention.

What is claimed is:

1. In a semiconductor device comprising a substrate of one conductivity type, and an insulating layer formed on said substrate; the combination of a plurality of metal insulator semiconductor transistors formed in said substrate at spaced apart locations, each of said transistors having a source region and a drain region of a conductivity type opposite to said one conductivity type of said substrate and a gate electrode formed on said insulating layer, a conductive layer formed on said insulating layer to define a lead for supplying a clock pulse to the gate electrodes of said transistors and which bridges the space between said locations, and a diffusion region of said opposite conductivity type formed in said substrate intermediate said locations and being connected directly to said conductive layer for avoiding the discharge from the source region of one of said transistors to the source region of another of said transistors of a charge carried only by said source region of said one transistor when a clock pulse is supplied by said lead.

2. A semiconductor device according to claim 1, wherein said diffusion region is smaller in area than each of said source region and drain region.

3. A semiconductor device according to claim 1, wherein said diffusion region is disposed substantially midway between said locations.

4. A semiconductor device according to claim 3, wherein said insulating layer has a substantially greater thickness at said space between said locations and said diffusion region than at said locations of the transistors.

* * * * *